US011133824B2

(12) United States Patent
Kubo

(10) Patent No.: US 11,133,824 B2
(45) Date of Patent: Sep. 28, 2021

(54) ERROR CORRECTION DEVICE AND OPTICAL TRANSMISSION/RECEPTION DEVICE

(71) Applicant: MITSUBISHI ELECTRIC CORPORATION, Tokyo (JP)

(72) Inventor: Kazuo Kubo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/756,334

(22) PCT Filed: Nov. 27, 2017

(86) PCT No.: PCT/JP2017/042428
§ 371 (c)(1),
(2) Date: Apr. 15, 2020

(87) PCT Pub. No.: WO2019/102621
PCT Pub. Date: May 31, 2019

(65) Prior Publication Data
US 2020/0244286 A1    Jul. 30, 2020

(51) Int. Cl.
*H03M 13/00* (2006.01)
*H03M 13/11* (2006.01)
*H04B 10/40* (2013.01)

(52) U.S. Cl.
CPC .... *H03M 13/1105* (2013.01); *H03M 13/1154* (2013.01); *H03M 13/616* (2013.01); *H04B 10/40* (2013.01)

(58) Field of Classification Search
None
See application file for complete search history.

(56) References Cited

U.S. PATENT DOCUMENTS 8,286,050 B2 * 10/2012 Murakami ............ H03M 13/23
714/752
2011/0051831 A1    3/2011 Subrahmanya et al.
(Continued)

FOREIGN PATENT DOCUMENTS

EP    3 480 960 A1    5/2019
JP    2013-504253 A    2/2013
(Continued)

OTHER PUBLICATIONS

Extended European Search Report dated Sep. 24, 2020 for Application No. 17932846.3.
(Continued)

*Primary Examiner* — Phung M Chung
(74) *Attorney, Agent, or Firm* — Birch, Stewart, Kolasch & Birch, LLP

(57) ABSTRACT

Provided is an optical transmission/reception device including: an error correction encoding unit configured to encode a sequence to be transmitted with one type of LDPC code; and an error correction decoding unit configured to decode a received sequence encoded with the LDPC code. The error correction decoding unit performs decoding processing for the received sequence based on a check matrix of an LDPC convolutional code. The decoding processing is windowed decoding processing, which is performed by using a window extending over one or more check submatrices. A window size of the window and a decoding iteration count are configured to be variable, and the window size and the decoding iteration count are input from a control circuit connected to the error correction decoding unit.

4 Claims, 15 Drawing Sheets

(56) References Cited

U.S. PATENT DOCUMENTS

2013/0254633 A1 9/2013 Obata et al.
2016/0233979 A1 8/2016 Koike-Akino

FOREIGN PATENT DOCUMENTS

| JP | 2013-198017 A | 9/2013 |
| WO | 2011/028413 A1 | 3/2011 |
| WO | WO 2018/042699 A1 | 3/2018 |

OTHER PUBLICATIONS

Imai et al., "A New Multilevel Coding Method Using Error-Correcting Codes," IEEE Transactions on Information Theory, vol. IT-23, No. 3, May 1977, pp. 371-377.
Iyengar et al., "Windowed Decoding of Spatially Coupled Codes," 2011 IEEE International Symposium on Information Theory Proceedings, Aug. 2011, pp. 2552-2556.
Kudekar et al., "Threshold Saturation via Spatial Coupling: Why Convolutional LDPC Ensembles Perform So Well over the BEC," IEEE Transations on Information Theory, vol. 57, No. 2, Feb. 2011, pp. 803-834.

* cited by examiner

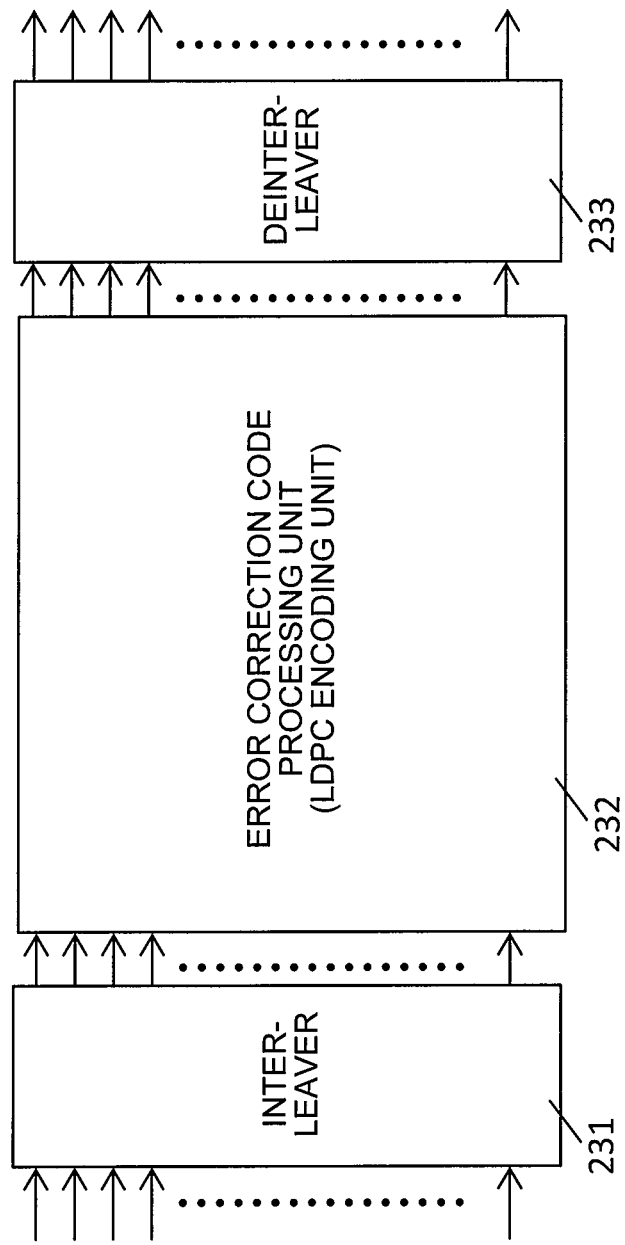

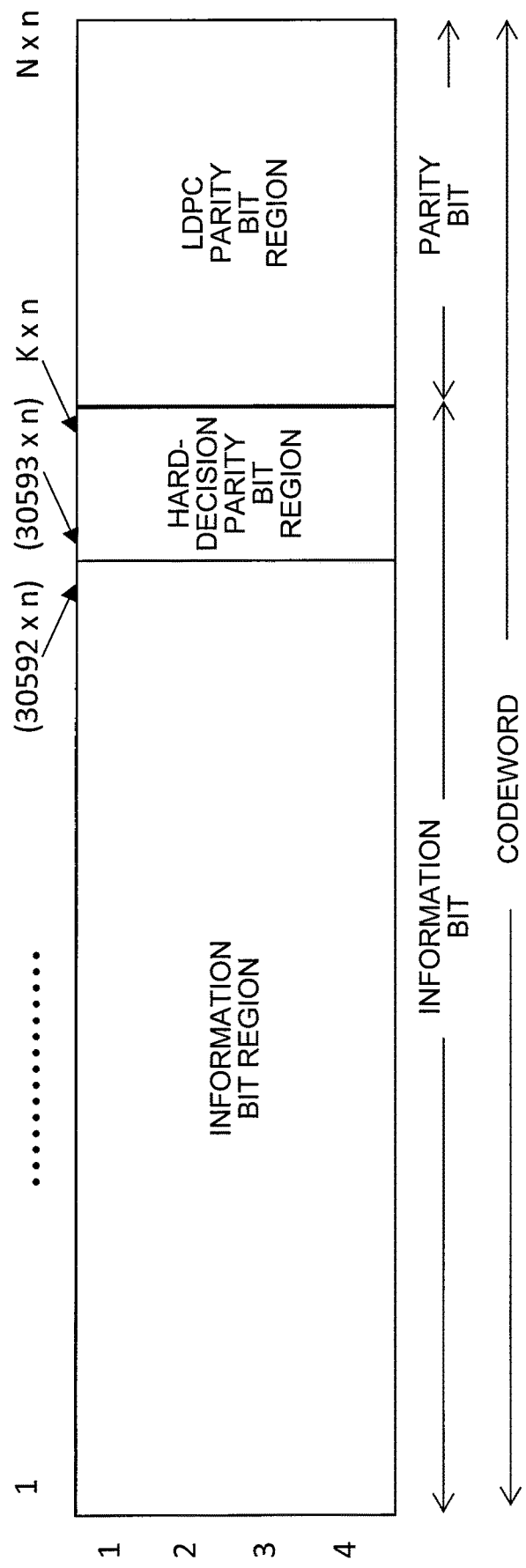

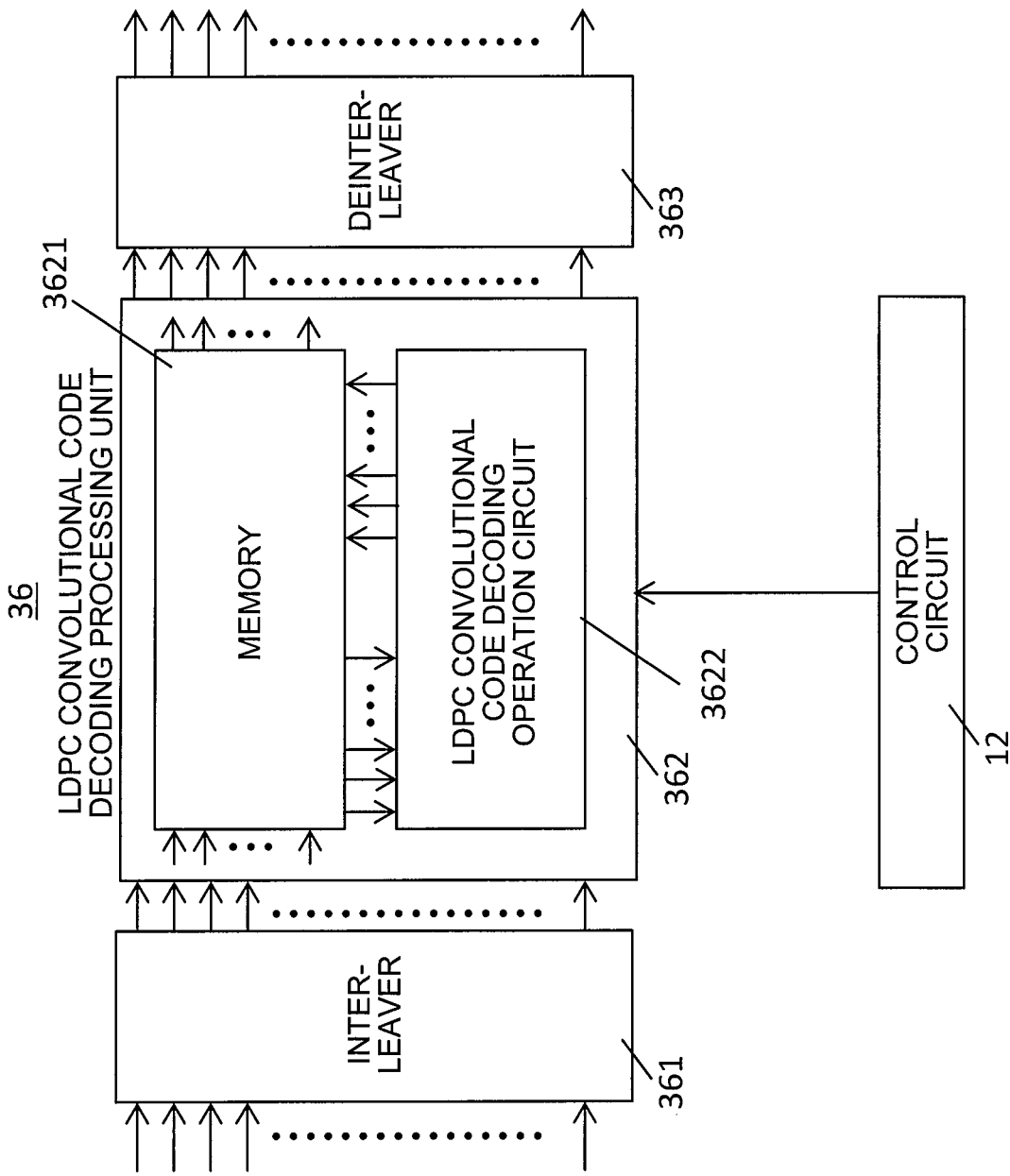

FIG. 6B

$$H = \begin{bmatrix} A_{0,0} & A_{0,1} & \cdots & A_{0,K-1} \\ A_{1,0} & A_{1,1} & \cdots & A_{1,K-1} \\ \vdots & \vdots & \vdots & \vdots \\ A_{J-1,0} & A_{J-1,1} & \cdots & A_{J-1,K-1} \end{bmatrix}$$

71

FIG. 7A $p$ COLUMNS $t$-th COLUMN $$I_j = \begin{pmatrix} 0 & \cdots & 0 & \boxed{1} & 0 & \cdots & 0 \\ 0 & \cdots & 0 & 0 & 1 & \cdots & 0 \\ \vdots & & \vdots & & \vdots & \ddots & \\ 0 & 0 & 0 & 0 & 0 & 0 & 1 \\ 1 & 0 & 0 & 0 & 0 & 0 & 0 \\ & \ddots & & 0 & 0 & & \vdots \\ 0 & & \boxed{1} & 0 & 0 & \cdots & 0 \end{pmatrix} \Bigg\} p \text{ ROWS}$$

$(t\text{-}1)$th COLUMN

FIG. 7B $$T_5^{(1)} = \begin{bmatrix} 0 & 0 & 0 & 1 & 0 \\ 0 & 0 & 1 & 0 & 0 \\ 0 & 1 & 0 & 0 & 0 \\ 1 & 0 & 0 & 0 & 0 \\ 0 & 0 & 0 & 0 & 1 \end{bmatrix}$$

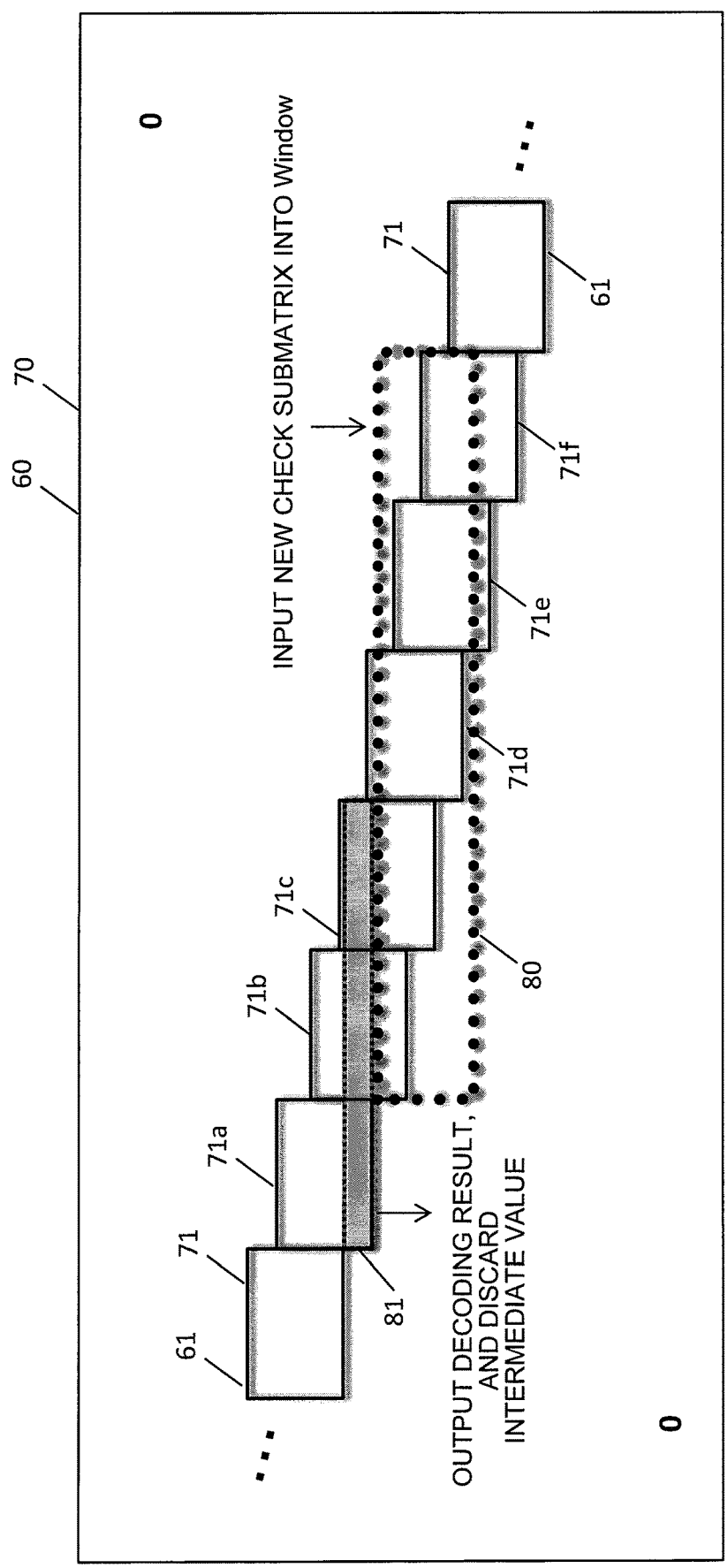

FIG. 10B
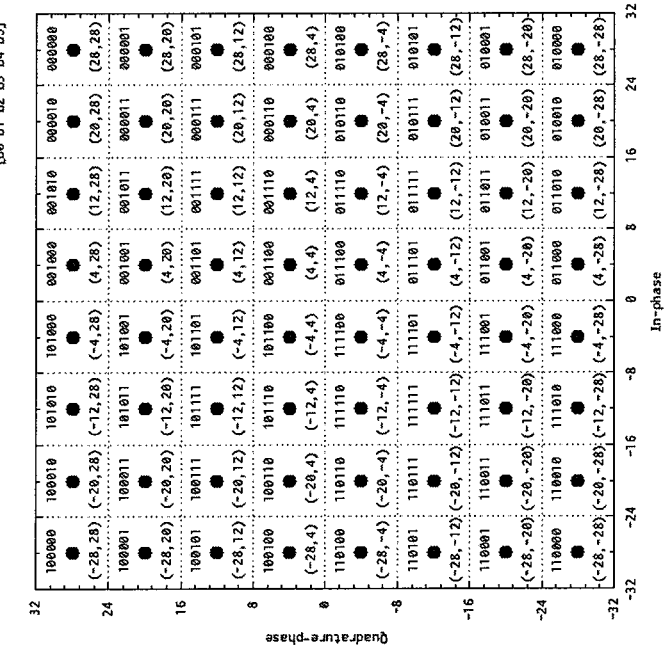
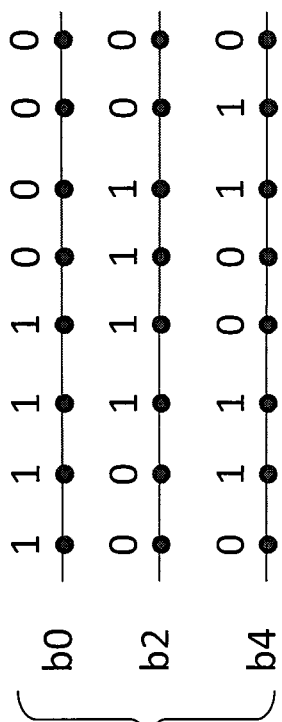

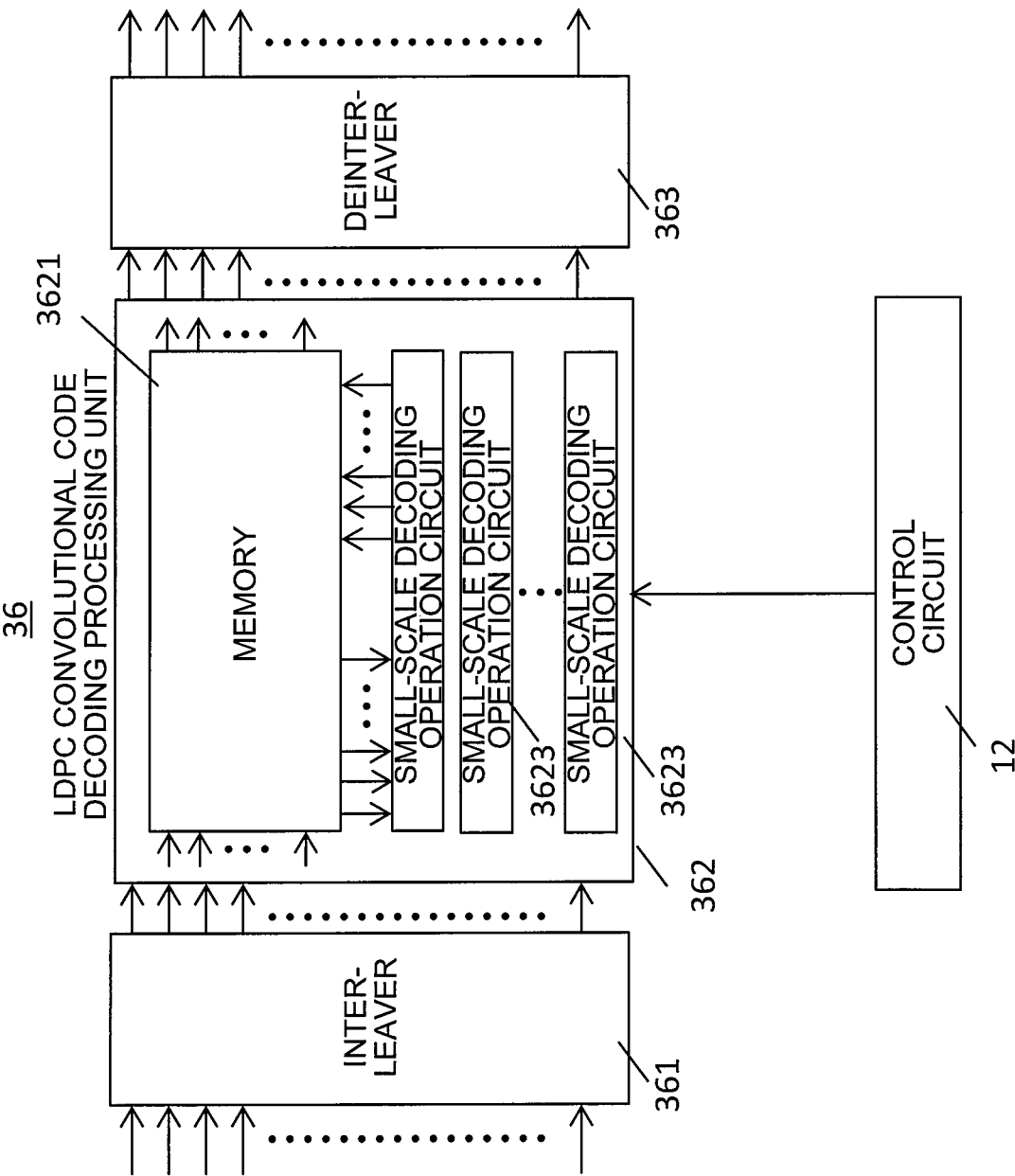

ERROR CORRECTION DEVICE AND OPTICAL TRANSMISSION/RECEPTION DEVICE

TECHNICAL FIELD

The present invention relates to an error correction device and an optical transmission/reception device, and more particularly, to an error correction device and an optical transmission/reception device, which are configured to support multi-level encoding.

BACKGROUND ART

In general, an optical transmission system of recent years employs an error correction code as an effective method for achieving a high transmission capacity and long-distance transmission. The error correction code is a technology used in, for example, a wired/wireless communication system and a storage device. The error correction code is a technology for adding a redundant bit to digital data to be transmitted on a transmission side, to thereby enable correction of an error (bit) that has occurred in received data.

As error correction encoding/decoding methods, various kinds of methods are proposed, such as Hamming codes, Bose-Chaudhuri-Hocquenghem (BCH) codes, and Reed-Solomon (RS) codes.

It is possible to detect and correct an error that has occurred in a transmission path by employing an error correction code. However, there is a limitation on the number of error bits that can be corrected. Further, the number of error bits that can be corrected differs depending on the error correction performance and decoding method of an error correction encoding method.

In an error correction code, transmission data containing an overhead and other information forming a frame is called "information bit". Further, a redundant bit added to an information bit is called "parity bit". The parity bit is calculated from an information bit by a calculation method that differs depending on the error correction encoding method. Further, a bit string obtained by combining an information bit and a parity bit is called "codeword".

In an error correction code called "block code", a parity bit is calculated from an information bit in units of the number of bits set in advance. That is, the number of information bits and the number of parity bits are determined within one codeword, and are called "information bit length" and "parity bit length", respectively. Further, the number of bits of a codeword is called "code length".

A metro core optical transfer system to be used for a submarine cable and intercity communication has a significant demand for expanding the transmission capacity and transmission distance, and sophisticated error correction codes are being employed and proposed on a daily basis. In recent years, a low-density parity-check (LDPC) code has been widely used as the error correction code. The LDPC code is a block code defined by a sparse parity-check matrix with a small number of non-zero elements.

Further, as a method for achieving improvement of error correction performance of the LDPC code, there have been known methods described in Non-Patent Literature 1 and Non-Patent Literature 2, for example. In Non-Patent Literature 1 and Non-Patent Literature 2, the configuration of a spatially-coupled forward error correction (FEC) is proposed. In the configuration of the spatially-coupled FEC, a spatially-coupled LDPC code is used.

The spatially-coupled LDPC code is one of the LDPC convolutional codes. The spatially-coupled LDPC code is obtained by applying the basic structure of the LDPC convolutional code to convert a code sequence from a continuous sequence to an end-of-block sequence. In the spatially-coupled LDPC code, check submatrices are used to construct submatrices of a check matrix of the spatially-coupled LDPC code. Specifically, a plurality of check submatrices are combined with each other diagonally to construct a larger check matrix, and this check matrix serves as a check matrix of the spatially-coupled LDPC code.

In Non-Patent Literature 1, there is a description that a belief propagation (BP) decoding method is used to achieve high error correction performance close to the theoretical limit.

However, while the spatially-coupled LDPC code is expected to exhibit improvement in its performance as the combined code length becomes larger, the spatially-coupled LDPC code causes expansion of a decoding circuit and delay. Accordingly, in Non-Patent Literature 2, the application of windowed decoding to a spatially-coupled LDPC code is proposed as a method for suppressing an increase in circuit scale and suppressing delay.

Further, in optical transmission systems of recent years, in order to implement communication having high frequency usage efficiency, multi-level modulation methods, such as M-ary quadrature amplitude modulation (M-QAM) and M-ary phase-shift keying (M-PSK), have been increasingly applied.

Further, for multi-level modulation methods, as in Non-Patent Literature 3, for example, there has been proposed a method involving applying multi-level encoding that uses an error correction code having redundancy that is different for each bit of a multi-level symbol, to thereby achieve high frequency usage efficiency with a small circuit scale.

CITATION LIST

Non Patent Literature

[NPL 1] S. Kudekar, T. Richardson, and R. L. Urbanke, "Threshold Saturation via Spatial Coupling: Why Convolutional LDPC Ensembles Perform So Well over the BEC," IEEE Transactions on Information Theory, Vol. 57, No. 2, pp. 803-834, February 2011.

[NPL 2] A. R. Iyengar, P. H. Siegel, R. L. Urbanke and J. K. Wolf, "Windowed Decoding of Spatially Coupled Codes," Proceedings 2011 IEEE International Symposium on Information Theory (ISIT), pp. 2552-2556, August 2011.

[NPL 3] H. Imai and S. Hirakawa, "A New Multilevel Coding Method Using Error-Correcting Codes," IEEE Transactions on Information Theory, Vol. IT-23, No. 3, pp. 371-377, May 1977.

SUMMARY OF INVENTION

Technical Problem

In an optical transmission system of recent years, the system accommodates signals at a wide variety of client rates due to expansion of the transmission capacity. For example, in an IEEE system, Flex Ethernet (trademark), which supports 200 GbE or 400 GbE as the transmission capacity of 100 GbE or more and can flexibly accommodate signals, is progressively standardized. Further, in an ITU-T system, ITU-T Recommendations G.709/Y.1331 are progressively standardizing a frame format (OTUCn) that can be used in units of n×100 G (n is an integer) as an optical transmission network of more than 100 G. An optical transceiver included in an optical transmission device is required to have a function of flexibly accommodating a plurality of those client signals and transmitting signals to a line side at the same rate.

In Non-Patent Literature 1, the BP decoding method is proposed to be used to achieve high error correction performance. Further, in Non-Patent Literature 2, spatially-coupled LDPC encoding and windowed decoding are proposed to be used to achieve high error correction performance with a small circuit scale that has relatively suppressed complexity.

However, a configuration for handling various throughputs is not proposed and intended in any of Non-Patent Literature 1 and Non-Patent Literature 2.

In Non-Patent Literature 3, there is proposed multi-level encoding that uses an error correction code having redundancy that is different for each bit of a multi-level symbol. In Non-Patent Literature 3, an error correction code having small redundancy is used for a bit in which an error is less likely to occur, while an error correction code having large redundancy is used for a bit in which an error is more likely to occur. It is therefore required to provide a plurality of types of error correction circuits, and hence the configuration becomes complicated.

Also in Non-Patent Literature 3, a configuration for handling various throughputs is not proposed and intended as in Non-Patent Literature 1 and Non-Patent Literature 2.

The present invention has been made in order to solve the above-mentioned problems, and has an object to provide an error correction device and an optical transmission/reception device, which relate to multi-level encoding, and are capable of handling various throughputs without changing a circuit configuration.

Solution to Problem

According to one embodiment of the present invention, there is provided an optical transmission/reception device including: an error correction encoding device configured to encode a sequence to be transmitted with one type of LDPC code; an error correction decoding device configured to decode a received sequence encoded with the one type of LDPC code; and a control circuit configured to control the error correction encoding device and the error correction decoding device, wherein the error correction encoding device is configured to perform encoding processing for the sequence to be transmitted based on a check matrix of an LDPC convolutional code having one type of redundancy and code length, wherein the error correction decoding device is configured to perform decoding processing for the received sequence based on the check matrix of the LDPC convolutional code, wherein the check matrix of the LDPC convolutional code includes a plurality of check submatrices combined with each other in an LDPC rule structure, wherein the decoding processing includes windowed decoding processing of sequentially performing decoding in units of windows by using a window including, at least partially, one or more check submatrices, wherein the windowed decoding processing is repeatedly executed by a number of times corresponding to a decoding iteration count, wherein a window size of the window and the decoding iteration count are configured to be variable depending on a throughput input to the error correction decoding device, and wherein the window size and the decoding iteration count are input from the control circuit to the error correction decoding device.

Advantageous Effects of Invention

According to the optical transmission/reception device of the present invention, the window size and the decoding iteration count are configured to be variable depending on the throughput input to the error correction decoding unit. With this configuration, it is possible to perform the multi-level encoding capable of handling various throughputs without changing a circuit configuration.

BRIEF DESCRIPTION OF DRAWINGS

FIG. 3 is a diagram for illustrating a configuration of an error correction encoding unit included in the optical transmission/reception device according to the first embodiment of the present invention.

FIG. 4 is a diagram for illustrating a frame structure of a signal to be output from the error correction encoding unit included in the optical transmission/reception device according to the first embodiment of the present invention.

FIG. 5 is a block diagram for illustrating a configuration of an error correction decoding unit included in the optical transmission/reception device according to the first embodiment of the present invention.

FIG. 6B is a diagram for illustrating an example of a check matrix of a quasi-cyclic LDPC code forming a check submatrix contained in the check matrix of the spatially-coupled LDPC code to be used in the error correction decoding unit of the optical transmission/reception device according to the first embodiment of the present invention.

FIG. 7A is a diagram for illustrating an example of a cyclic permutation matrix.

FIG. 7B is a diagram for illustrating an example of the cyclic permutation matrix.

FIG. 8 is a diagram for illustrating an example of the check matrix of the spatially-coupled LDPC code to be used in the error correction decoding unit of the optical transmission/reception device according to the first embodiment of the present invention.

FIG. 10B is a diagram for illustrating an example of constellation mapping for 64-QAM in the optical transmission/reception device according to the first embodiment of the present invention.

FIG. 12 is a block diagram for illustrating a configuration of an error correction decoding unit of an optical transmission/reception device according to a second embodiment of the present invention.

DESCRIPTION OF EMBODIMENTS

First Embodiment

Figure 1:
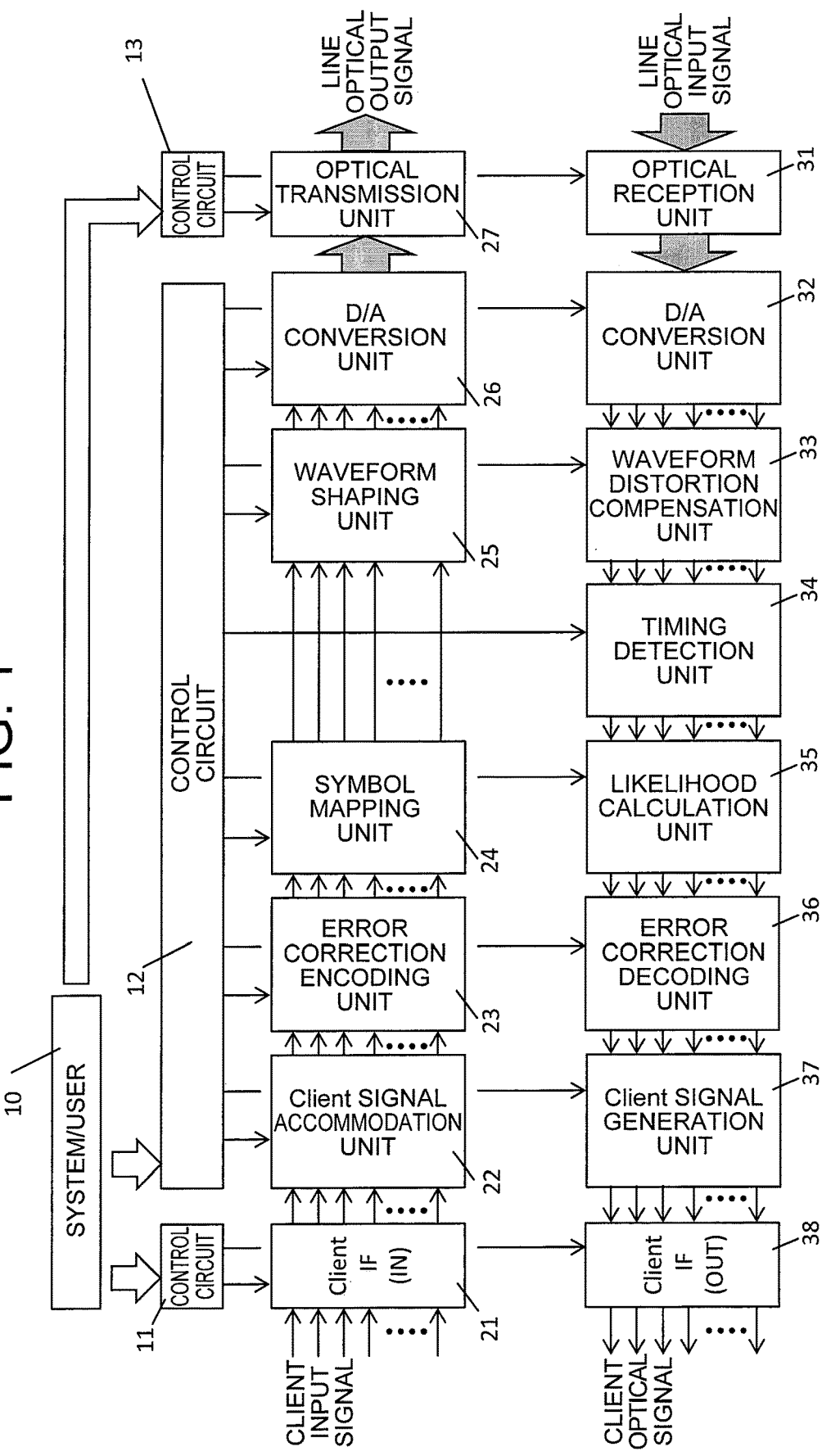
FIG. 1 is a block diagram for illustrating a configuration of an optical transmission/reception device according to a first embodiment of the present invention.

FIG. 1 is a block diagram for illustrating a configuration of an optical transmission/reception device according to a first embodiment of the present invention.

The optical transmission/reception device includes an error correction encoding device, which includes an error correction encoding unit 23, and an error correction decoding device, which includes an error correction decoding unit 36.

The error correction encoding unit 23 encodes a sequence to be transmitted, which is to be transmitted by the optical transmission/reception device, with an LDPC code. Further, the error correction decoding unit 36 decodes a received sequence received by the optical transmission/reception device, which has been encoded with an LDPC code.

Now, the configuration of the optical transmission/reception device is described.

In FIG. 1, a client IF (IN) 21 is an input interface circuit, to which a client signal is to be input. A client input signal is input to the client IF (IN) 21 from an external system or by a user. The client input signal is a signal to be transmitted by the optical transmission/reception device. A client signal accommodation unit 22 is connected to the client IF (IN) 21.

The client input signal input to the client IF (IN) 21 is input to the client signal accommodation unit 22. The client signal accommodation unit 22 accommodates the client input signal into a transmission frame to frame the client input signal into a form appropriate for subsequent processing. The client signal accommodation unit 22 includes, for example, a framer circuit. The error correction encoding unit 23 is connected to the client signal accommodation unit 22.

The transmission frame generated by the client signal accommodation unit 22 is input to the error correction encoding unit 23. The error correction encoding unit 23 adds a parity bit to the input transmission frame in accordance with a suitable rule to generate a codeword. The parity bit is described later with reference to FIG. 4. As described above, the codeword is a bit string obtained by combining an information bit and the parity bit. The error correction encoding unit 23 forms the error correction encoding device. A symbol mapping unit 24 is connected to the error correction encoding unit 23.

The codeword generated by the error correction encoding unit 23 is input to the symbol mapping unit 24. The symbol mapping unit 24 encodes the input codeword into a form suitable for transmission on the line side and causes the input codeword to take multiple values. The symbol mapping unit 24 includes, for example, a mapping circuit. A waveform shaping unit 25 is connected to the symbol mapping unit 24.

The signal output from the symbol mapping unit 24 is input to the waveform shaping unit 25. The waveform shaping unit 25 equalizes an analog waveform of the input signal in time and frequency domains to shape the signal into a form appropriate for transmission. The waveform shaping unit 25 includes, for example, a signal processing circuit. A D/A conversion unit 26 is connected to the waveform shaping unit 25.

The digital signal generated by the waveform shaping unit 25 is input to the D/A conversion unit 26. The D/A conversion unit 26 converts the input digital signal into an analog electrical signal. The D/A conversion unit 26 includes, for example, a D/A converter. An optical transmission unit 27 is connected to the D/A conversion unit 26.

The analog electrical signal output from the D/A conversion unit 26 is input to the optical transmission unit 27. The optical transmission unit 27 converts the input analog electrical signal into an optical signal, and transmits the optical signal through an optical fiber. The optical transmission unit 27 includes, for example, an optical transmission circuit.

The above-mentioned configuration of from the client IF (IN) 21 to the optical transmission unit 27 is a transmission-side configuration of the optical transmission/reception device.

Next, a reception-side configuration of the optical transmission/reception device is described.

In FIG. 1, an optical reception unit 31 receives an optical signal that has been transmitted via the optical fiber. The optical reception unit 31 converts the received optical signal into an analog electrical signal. The optical reception unit 31 includes, for example, an optical receiver. An A/D conversion unit 32 is connected to the optical reception unit 31.

The analog electrical signal is input to the A/D conversion unit 32 from the optical reception unit 31. The A/D conversion unit 32 converts the input analog electrical signal into a digital signal. The A/D conversion unit 32 includes, for example, an A/D converter. A waveform distortion compensation unit 33 is connected to the A/D conversion unit 32.

The digital signal output from the A/D conversion unit 32 is input to the waveform distortion compensation unit 33. The waveform distortion compensation unit 33 equalizes the digital signal in time and frequency domains for compensation so as to obtain an original signal that would have been transmitted. The waveform distortion compensation unit 33 includes, for example, a signal processing circuit. The waveform distortion compensation unit 33 compensates for distortion incurred on a transmission path or at an optical analog front end. A timing detection unit 34 is connected to the waveform distortion compensation unit 33.

The signal compensated for by the waveform distortion compensation unit 33 is input to the timing detection unit 34. The timing detection unit 34 detects the head of the transmission frame from the input signal for alignment. The timing detection unit 34 includes a timing detection processing circuit configured to detect the head of the transmission frame to detect timing. A likelihood calculation unit 35 is connected to the timing detection unit 34.

The aligned signal output from the timing detection unit 34 is input to the likelihood calculation unit 35. The likelihood calculation unit 35 calculates a log-likelihood ratio (LLR) of each bit of the signal subjected to symbol mapping. The likelihood calculation unit 35 includes, for example, a likelihood calculation circuit. An error correction decoding unit 36 is connected to the likelihood calculation unit 35.

The LLR of each bit calculated by the likelihood calculation unit 35 is input to the error correction decoding unit 36. The error correction decoding unit 36 performs error correction decoding processing for the received sequence based on the input LLR. The error correction decoding unit 36 forms the error correction decoding device. The error correction decoding unit 36 has a function for handling various transfer rates, that is, various throughputs. A configuration of the error correction decoding unit 36 is described later. A client signal generation unit 37 is connected to the error correction decoding unit 36.

The signal whose error has been corrected by the error correction decoding unit 36 is input to the client signal generation unit 37. The client signal generation unit 37 aligns the signal whose error has been corrected, to thereby produce a client output signal. The client signal generation unit 37 includes, for example, a client signal generation circuit. When a parity bit of HD-FEC is added to the received transmission frame, the client signal generation unit 37 also performs decoding processing for the HD-FEC. The client signal generation unit 37 adds an overhead to the produced client output signal as required. A client IF (OUT) 38 is connected to the client signal generation unit 37.

The client output signal generated by the client signal generation unit 37 is input to the client IF (OUT) 38. The client IF (OUT) 38 outputs the client output signal to the outside as output of the optical transmission/reception device. The client IF (OUT) 38 includes, for example, an output interface circuit. The client IF (OUT) 38 outputs the client output signal to an external device provided outside, for example, each client module.

The above-mentioned configuration of from the optical reception unit 31 to the client IF (OUT) 38 is the reception-side configuration of the optical transmission/reception device.

The transmission-side configuration of from the client IF (IN) 21 to the optical transmission unit 27 and the reception-side configuration of from the optical reception unit 31 to the client IF (OUT) 38 form an error correction device according to the first embodiment of the present invention.

The client IF (IN) 21 and the client IF (OUT) 38 are hereinafter collectively referred to as "client-side analog interface unit".

The components of from the client signal accommodation unit 22 to the D/A conversion unit 26 and the components of from the A/D conversion unit 32 to the client signal generation unit 37 are hereinafter collectively referred to as "digital signal processing unit".

The optical transmission unit 27 and the optical reception unit 31 are hereinafter collectively referred to as "optical analog modulation/demodulation unit".

In FIG. 1, control circuits 11, 12, and 13 are control circuits for controlling the above-mentioned units 21 and 38, the above-mentioned units 22 to 26 and 32 to 37, and the above-mentioned units 27 and 31, respectively, by receiving the setting from a system or user 10.

Specifically, the control circuit 11 is provided for the above-mentioned client-side analog interface unit, and controls the client-side analog interface unit.

The control circuit 12 is provided for the above-mentioned digital signal processing unit, and controls the digital signal processing unit.

The control circuit 13 is provided for the above-mentioned optical analog modulation/demodulation unit, and controls the optical analog modulation/demodulation unit.

As described above, in the first embodiment, one control circuit is separately provided for each of the client-side analog interface unit, the digital signal processing unit, and the optical analog modulation/demodulation unit. However, in the first embodiment, only one common control circuit may be provided for the client-side analog interface unit, the digital signal processing unit, and the optical analog modulation/demodulation unit, and the first embodiment can be implemented in this case as well.

Each of the control circuits 11 to 13 may be constructed from a dedicated circuit, but may include a processor and a memory. In this case, each of the processors included in the control circuits 11 to 13 reads out a program stored in the memory to execute the program, to thereby implement the functions of the control circuits 11 to 13. The control circuits 11 to 13 may also be constructed from hardware, software, firmware, or a combination thereof.

Next, an operation of the optical transmission/reception device according to the first embodiment is described.

On the transmission side, first, to the client IF (IN) 21, various client input signals to be accommodated into the transmission frame by the optical transmission/reception device according to the first embodiment are input. The client IF (IN) 21 is, for example, an interface such as CAUI-4 or CAUI-10 when the standard is 100 GbE, but the client IF (IN) 21 may have any configuration in the first embodiment.

Figure 2:
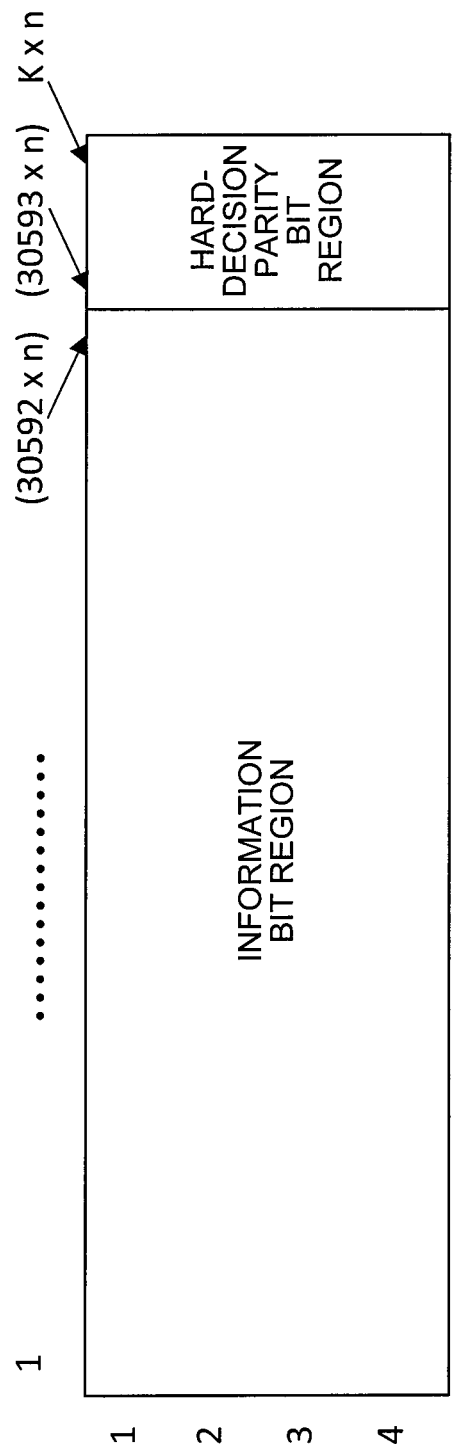
FIG. 2 is a diagram for illustrating a frame structure of a signal to be transmitted/received by the optical transmission/reception device according to the first embodiment of the present invention.

The input client input signal is accommodated into the transmission frame by the client signal accommodation unit 22, and is framed into a form appropriate for long-distance transmission on the line side. The client signal accommodation unit 22 adds a parity bit of a hard-decision forward error correction (HD-FEC) code as an external code as required. In FIG. 2, an example of the transmission frame to which the parity bit of HD-FEC is added is illustrated.

FIG. 2 is an illustration of a frame structure of a transmission frame in a case where, for example, a frame format on the line side is set to a transmission frame in which a redundant region of HD-FEC is added to OTUCn. It is assumed here that the redundancy of HD-FEC is indefinite. In the example illustrated in FIG. 2, a hard-decision parity bit region is added to an information bit region. The hard-decision parity bit region accommodates the parity bit of HD-FEC. In the OUTCn, the transmission capacity per unit time is n×239÷226×99.5328 Gbps (not including a parity bit). Accordingly, in the following description, the structure illustrated in FIG. 2 is used as a frame format, and an error correction encoding unit and an error correction decoding unit to/from which signals are input/output in units of about 100 Gbps are used as the error correction encoding unit 23 and the error correction decoding unit 36, respectively. However, the first embodiment is not limited thereto.

The error correction encoding unit 23 adds a parity bit to the transmission frame output from the client signal accommodation unit 22 in accordance with a suitable rule to generate a codeword.

FIG. 3 is an illustration of an example of a configuration of the error correction encoding unit 23 in the first embodiment. In the example illustrated in FIG. 3, the error correction encoding unit 23 includes an interleaver 231, an LDPC encoding circuit 232 serving as an error correction code processing unit, and a deinterleaver 233. The interleaver 231 and the deinterleaver 233 are arranged on respective sides of the LDPC encoding circuit 232. The error correction encoding unit 23 encodes the sequence to be transmitted based on the check matrix of the LDPC convolutional code having one type of redundancy and code length. A check matrix 70 of the LDPC convolutional code is described later with reference to FIG. 6A. Now, each component forming the error correction encoding unit 23 is described.

First, n×100 G (n is an integer) signals are input to the interleaver 231 in accordance with a bit rate of accommodation by the client signal accommodation unit 22. In this case, the signal is accommodated in an OTUCn frame format. The interleaver 231 interleaves the input signal, and inputs the resultant signal to the LDPC encoding circuit 232.

The LDPC encoding circuit 232 adds a parity bit based on an LDPC parity generation rule to the input signal, and inputs the resultant signal to the deinterleaver 233.

The deinterleaver 233 deinterleaves the input signal, and inputs the resultant signal to the symbol mapping unit 24.

When a parity bit of HD-FEC is added to the frame structure input to the LDPC coding circuit 232, the LDPC coding circuit 232 also processes the parity bit of HD-FEC as the information bit.

FIG. 4 is an illustration of a frame structure to be output from the deinterleaver 233 of the error correction encoding unit 23. In the frame structure of FIG. 4, the information bit region accommodating the client input signal and the hard-decision parity bit region as a whole are set as the information bit. An LDPC parity bit region is added to the information bit. The redundancy of the error correction code differs depending on the requested modulation method and transmission performance. Accordingly, k and N (integers satisfying k>30,592 and N>k) relating to the frame format are not defined in the first embodiment.

The signal output from the error correction encoding unit 23 is input to the symbol mapping unit 24, and is converted into a form suitable for transmission on the line side. A method of converting the signal by the symbol mapping unit 24 includes causing the signal to take multiple values, multi-dimensional coding, and differential coding, for example. Further, the method of converting the signal by the symbol mapping unit 24 includes, for example, adding a pilot (known) signal to be used in subsequent processing. The output signal from the symbol mapping unit 24 is input to the waveform shaping unit 25.

The waveform shaping unit 25 equalizes a quasi-analog waveform of the input signal in the time domain, in the frequency domain, or in both the domains, to thereby shape the waveform. The method of shaping the waveform by the waveform shaping unit 25 includes, for example, Nyquist filtering and band compensation by an analog unit.

The output from the waveform shaping unit 25 is converted into an analog electrical signal by the D/A conversion unit 26. The analog electrical signal output from the D/A conversion unit 26 is converted into an optical signal by the optical transmission unit 27, and transmitted to the transmission path, for example, the optical fiber.

The transmission-side operation of the optical transmission/reception device is as described above. Next, the reception-side operation of the optical transmission/reception device is described.

On the reception side, first, an optical signal transmitted via the optical fiber is input to the optical reception unit 31. The optical reception unit 31 converts the received optical signal into an analog electrical signal. The analog electrical signal output from the optical reception unit 31 is input to the A/D conversion unit 32.

The A/D conversion unit 32 converts the input analog electrical signal into a digital signal. The digital signal is input to the waveform distortion compensation unit 33.

The waveform distortion compensation unit 33 performs processing of compensating for distortion of the digital signal, which is incurred, for example, on the transmission path or at the optical analog front end. The method of compensating for distortion includes, for example, linear compensation such as band compensation and disperse compensation, non-linear compensation by a fiber or an optical device, a frequency offset of a transmission/reception optical source, and phase compensation. The output from the waveform distortion compensation unit 33 is input to the timing detection unit 34.

The timing detection unit 34 detects the timing, and detects the head of a frame, or the head of a multi-frame as required, for alignment. The output from the timing detection unit 34 is input to the likelihood calculation unit 35.

The likelihood calculation unit 35 receives the compensated signal, calculates an LLR of each bit subjected to symbol mapping, and inputs the LLR to the error correction decoding device 36.

FIG. 5 is an illustration of an example of the configuration of the error correction decoding unit 36 in the first embodiment. In the example illustrated in FIG. 5, the error correction decoding unit 36 includes an interleaver 361, an LDPC convolutional code decoding processing unit 362, and a deinterleaver 363. The deinterleaver 363 and the interleaver 361 are arranged on respective sides of the LDPC convolutional code decoding processing unit 362. The error correction decoding unit 36 performs decoding processing for the received sequence based on the check matrix of the LDPC convolutional code having one type of redundancy and code length. Now, each component forming the error correction decoding unit 36 is described.

The LDPC convolutional code decoding processing unit 362 inputs n×100 G (n is an integer) signals from the line side, and outputs n×100 G (n is an integer) signals of an OTUCn structure.

As illustrated in FIG. 5, the LDPC convolutional code decoding processing unit 362 includes a memory 3621 and an LDPC convolutional code decoding operation circuit 3622.

Figure 6A:
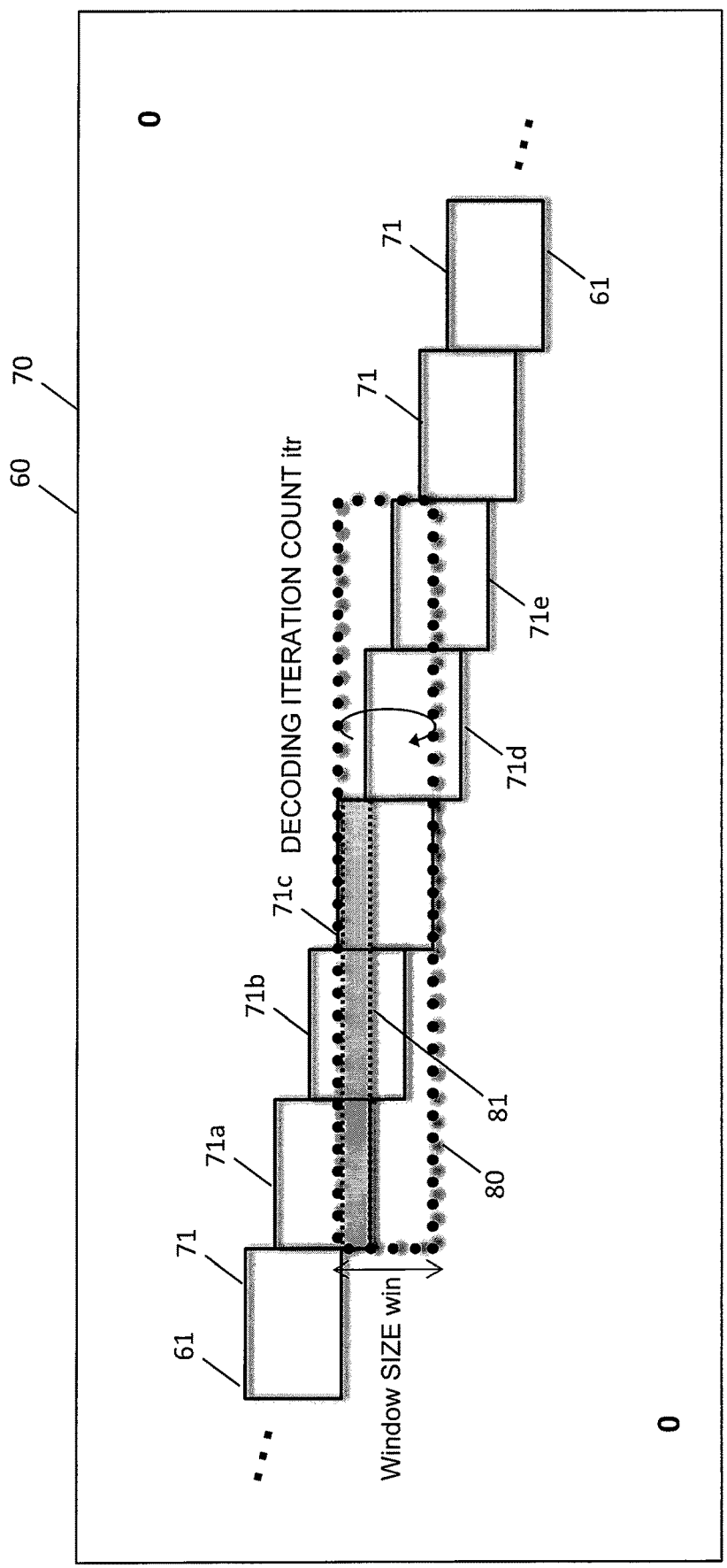
FIG. 6A is a diagram for illustrating an example of a check matrix of a spatially-coupled LDPC code to be used in the error correction decoding unit of the optical transmission/reception device according to the first embodiment of the present invention.

Further, the LDPC convolutional code decoding processing unit 362 is controlled by the control circuit 12. The LDPC convolutional code decoding processing unit 362 performs decoding processing by using such a check matrix as illustrated in FIG. 6A. Now, the check matrix is described with reference to FIG. 6A.

In FIG. 6A, a quadrangle 60 enclosing the entire matrix represents the entire check matrix 70 (having M rows and N columns) of the LDPC convolutional code. Further, a quadrangle 61 within the quadrangle 60 represents a submatrix of the LDPC convolutional code. The submatrix is hereinafter referred to as "check submatrix 71". Matrix elements of the check matrix 70 of the LDPC convolutional code represented by the quadrangle 60 all take 0 in parts other than the check submatrices 71.

The check submatrix 71 is a check matrix itself. The check matrix 70 of the LDPC convolutional code is an LDPC convolutional code formed by connecting the basic check submatrices 71 in an LDPC rule structure. Specifically, as illustrated in FIG. 6A, a plurality of check submatrices 71 are combined with each other so as to be aligned obliquely in a right-bottom direction to form one larger check matrix 70. The adjacent check submatrices 71 are shifted from each other by k rows set in advance (k is an integer of 1 or more). That is, taking a check submatrix 71a and a check submatrix 71b as an example for description, the check submatrix 71b is shifted in a downward direction by k rows with respect to the adjacent check submatrix 71a. In this manner, the check submatrices 71 are combined with each other such that each check submatrix 71 is shifted in the downward direction by k rows with respect to the adjacent left check submatrix 71.

For example, a quasi-cyclic (QC) LDPC code (hereinafter referred to as "QC-LDPC code") can be applied to the check submatrix 71. The QC-LDPC is briefly described below.

Now, a check matrix H of an LDPC code illustrated in FIG. 6B is assumed as the check submatrix 71. The check matrix H is formed of a plurality of partial matrices (also called "block matrix") $A_{j,k}$, where j takes a value of from 0 to J−1, and J is a positive integer, and further, k takes a value of from 0 to K−1, and K is a positive integer. When those partial matrices $A_{j,k}$ are limited to any one of a cyclic permutation matrix and a zero matrix, the check matrix H is a QC-LDPC code. For the QC-LDPC code, the configuration of the check matrix and implementation of the circuit are relatively easy, and are often used for practical use.

The cyclic permutation matrix is a matrix obtained by subjecting a unit matrix to cyclic shifting. In FIG. 7A, an example of the cyclic permutation matrix is illustrated. The cyclic permutation matrix illustrated in FIG. 7A is a matrix having p rows and p columns. When a matrix element at an x-th row and a y-th column of the cyclic permutation matrix is denoted by (x, y), matrix elements (1, t), (2, t+1), (3, t+2), . . . , (t, p) are 1. Further, matrix elements (t+1, 1), (t+2, 2), . . . , (p, t−1) are 1. Other matrix elements are all 0. In this manner, in the cyclic permutation matrix, a plurality of unit matrices are subjected to cyclic shifting. The cyclic permutation matrix is denoted by $I_p^{(a)}$ through use of a size "p" of the matrix and a shift value "a" in the right direction of the row. $I_p^{(0)}$ is a unit matrix. Further, for example, $I_5^{(1)}$ is a matrix illustrated in FIG. 7B. Accordingly, the cyclic permutation matrix of FIG. 7A is denoted by $I_p^{(t-1)}$ because the size of the matrix is "p" and the matrix element at the first row and a t-th column is "1", resulting in a shift value "a" of "t−1".

In the first embodiment, the error correction decoding unit 36 uses a window 80 having a window size extending over one or more check submatrices 71 to perform windowed decoding processing in units of the window size. In the example of FIG. 6A, as indicated by the thick dotted lines, the window extending over five check submatrix 71 is illustrated. Specifically, in the example of FIG. 6A, the window 80 includes, at least partially, five check submatrices 71 of check submatrices 71a, 71b, 71c, 71d, and 71e. The number of check submatrices 71 included in the window 80 is not limited to five, and may be set to any number of one or more.

In the windowed decoding processing, the window 80 is decoded for each row in the column direction. Specifically, as indicated by the thin dotted lines of FIG. 6A, first, processing of decoding a top row 81 in the window 80 is performed. At this time, the row 81 contains one row of each of the check submatrices 71a, 71b, and 71c. After that, the processing is advanced sequentially for each row toward the bottom row. Then, when the processing reaches the bottom row in the window 80, the processing returns to the top row 81 in the window 80, and decoding processing is performed again in order from the top row toward the bottom row. In this manner, in the windowed decoding processing, decoding processing is repeatedly performed for each row contained in one window 80.

The number of times of the above-mentioned repetition is hereinafter referred to as "decoding iteration count itr". Then, when the decoding processing for the window 80 is all finished by the decoding iteration count itr, a result of calculation obtained for the top row 81 of the window 80 is output, and intermediate values obtained during the calculation are discarded.

Further, the position of the window 80 is shifted. In FIG. 8, the position of the window 80 after being shifted is illustrated. As can be understood from the comparison between FIG. 6A and FIG. 8, the window 80 is shifted toward the right bottom direction such that the state of FIG. 6A transitions to the state of FIG. 8. Specifically, the window 80 is shifted in the downward direction by k rows of the check matrix 71, and is also shifted in the right direction by a total number of columns of the check matrix 71. As a result, the check submatrix 71a is excluded from the window 80, and a part of a check submatrix 71f is newly input to the window 80. This produces a new window 80. The new window 80 extends over five check submatrices of the check submatrices 71b, 71c, 71d, 71e, and 71f. In this manner, repeated decoding processing similar to the above-mentioned decoding processing is executed for the new window 80.

When the windowed decoding is applied to the LDPC convolutional code, its performance is improved in accordance with the window size of the window 80. At the same time, the memory size required for the decoding processing is required to be increased in accordance with the increase of the window size. Further, the performance of the above-mentioned decoding method is improved in accordance with the increase in the decoding iteration count itr. At the same time, the circuit scale and power consumption increase in accordance with the increase in the decoding iteration count itr. In other words, while it is required to increase the window size and the decoding iteration count in order to improve the performance, it is required in this case to increase the size of the memory and a circuit scale. When the size of the memory and the circuit scale are large, implementation of the circuit becomes difficult. It is accordingly difficult to improve the performance while suppressing expansion of the circuit scale and securing easiness to implement the circuit. Therefore, the performance and the circuit scale and circuit implementation have a trade-off relationship.

In the first embodiment, the LDPC convolutional code decoding processing unit 362 includes a memory supporting a window size that can be implemented at the maximum at the time of the minimum throughput. The control circuit 12 thus changes the window size and the decoding iteration count in accordance with the throughput input to the error correction decoding unit 36, to thereby handle a plurality of throughputs. The window size is set in this case to have a size of the window 80 in the column direction. Accordingly, in the example of FIG. 8, the size of the window 80 in the column direction has such a width as to contain just one check submatrix 71, and hence, when the number of rows of the check submatrix 71 is represented by p, a window size win of the window 80 is "p". In the first embodiment, the size of the window 80 in the row direction is set to have a fixed value, but may also be variable. In the example of FIG. 8, the size of the window 80 in the row direction has such a width as to contain just five check submatrices 71, and hence, when the number of columns of the check submatrix 71 is represented by p, the size of the window 80 in the row direction is "p×5".

Further, in order to implement this processing as pipeline processing, decoding processing for the current window 80 is required to be finished at the time when signals required for processing of the next check submatrix 71 have been ready for processing. Accordingly, as a method of determining the window size win and the decoding iteration count itr for each throughput, for example, there is conceivable a method involving setting a maximum value of the window size at the time of the minimum throughput as the maximum value of a memory size that is superior in terms of implementation, and setting a maximum value of the decoding iteration count itr so that a product of the window size win and the decoding iteration count itr is equal to or smaller than a unit time required for the decoding processing. However, the first embodiment is not limited to this method, and another method may be employed.

Figure 9:
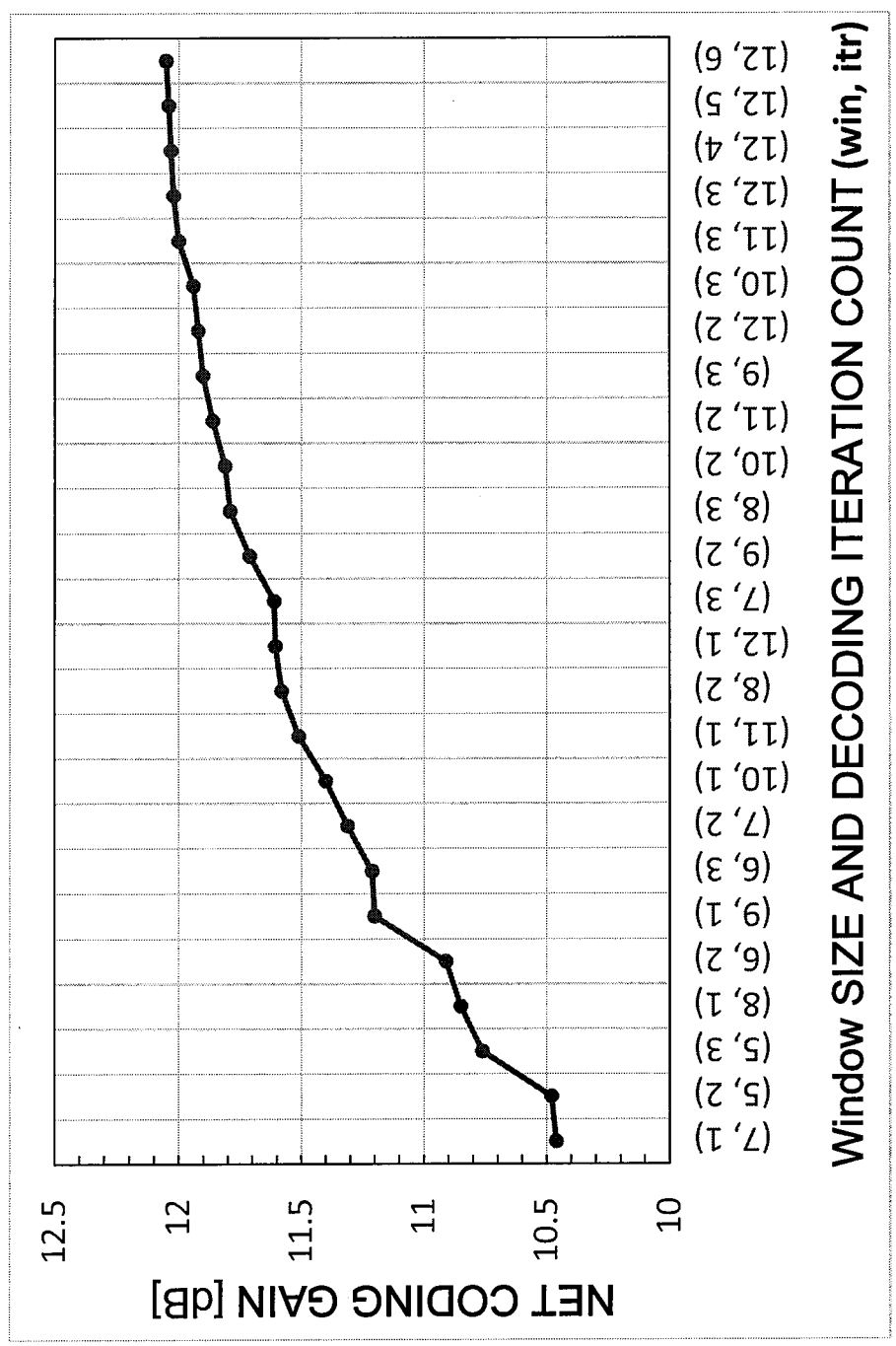
FIG. 9 is a graph for showing an example of a net coding gain with respect to a window size and a decoding iteration count in the optical transmission/reception device according to the first embodiment of the present invention.

FIG. 9 is an illustration of an example of a correspondence relationship of a net coding gain with respect to the window size win of the window 80 and the decoding iteration count itr. When the window size is represented by win, and the decoding iteration count is represented by itr, the horizontal axis indicates "(win, itr)". Specifically, (7, 1) indicates that the window size win is "7" and the decoding iteration count itr is "1". When the window size win and the decoding iteration count itr are appropriately combined with each other in this manner, it is possible to flexibly handle throughputs and error correction performance of various granularities without changing the circuit configuration at all.

Accordingly, in the first embodiment, in the control circuit 12, for the processing capability of the LDPC convolutional code decoding processing unit 362 calculated in advance, a combination of the maximum window size win and decoding iteration count itr corresponding to each throughput, and a net coding gain corresponding to each combination are stored as a table. In response to the setting from the system or user 10, the control circuit 12 determines the window size win and the decoding iteration count itr based on the throughput of a signal input to the error correction decoding unit 36. However, the first embodiment is not limited to this method, and another method may be employed. For example, the following method may be employed: a combination of the maximum window size win and decoding iteration count itr for the processing capability of the LDPC convolutional decoding processing unit 362 and the throughput is formulated, and the control circuit 12 uses the formula for calculation.

Further, in the first embodiment, in the determination of the window size win and the decoding iteration count itr, the control circuit 12 takes into consideration not only the throughput but also an error rate of each bit forming each symbol of the received sequence received by the optical transmission/reception device.

When a multi-level modulation method such as 16-QAM and 64-QAM is used as a modulation method, an error occurrence frequency of each bit forming a symbol, that is, the error rate thereof, varies from one bit to another.

Figure 10A:
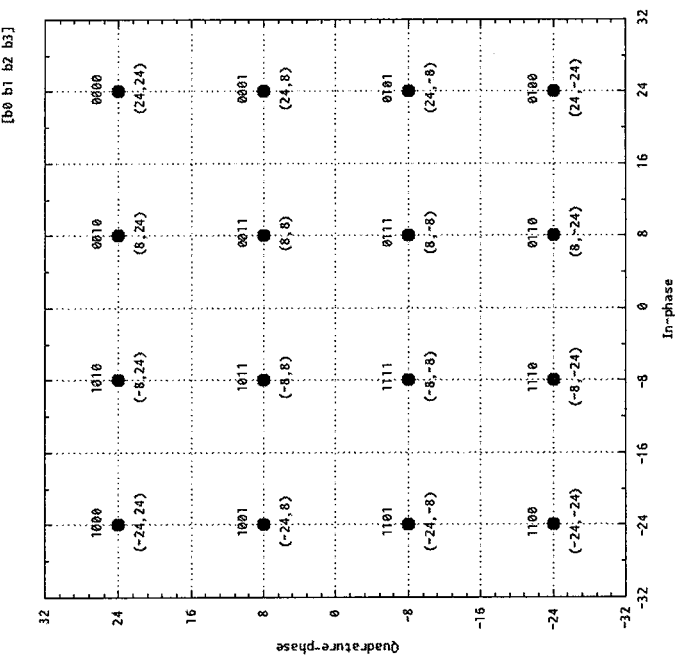
FIG. 10A is a diagram for illustrating an example of constellation mapping for 16-QAM in the optical transmission/reception device according to the first embodiment of the present invention.

FIG. 10A is an illustration of an example of constellation mapping for 16-QAM. Each symbol of 16-QAM is formed by four bits, and is represented as [b0, b1, b2, b3]. As shown in the arrangement of "0" and "1" for each bit, in a bit group of the bits b0 and b1, transition between "0" and "1" is less likely to occur than in a bit group of the bits b2 and b3. As a result, an error is less likely to occur in the bits b0 and b1, and hence the error rate is low in those bits. In contrast, an error is more likely to occur in the bits b2 and b3, and hence the error rate is high in those bits.

As described above, the error rate differs for each bit or bit group forming each symbol. Accordingly, in the first embodiment, the control circuit 12 stores the error rate of each bit or bit group in advance for each multi-level modulation method, calculates a net coding gain corresponding to the error rate of each bit or bit group, and determines a combination of the window size win and the decoding iteration count itr stored as the table.

Similarly, FIG. 10B is an illustration of an example of constellation mapping for 64-QAM. Each symbol of 64-QAM is formed by six bits, and is represented as [b0, b1, b2, b3, b4, b5]. As shown in the arrangement of "0" and "1"
for each bit, in a bit group of bits b0 and b1, transition between "0" and "1" is less likely to occur than in a bit group of bits b4 and b5. As a result, an error is less likely to occur in the bits b0 and b1, and hence the error rate is low in those bits. In contrast, an error is more likely to occur in the bits b4 and b5, and hence the error rate is high in those bits. Further, a frequency at which an error occurs in the bits b2 and b3 is intermediate therebetween, and hence the value of the error rate is also an intermediate value.

Figure 11A:
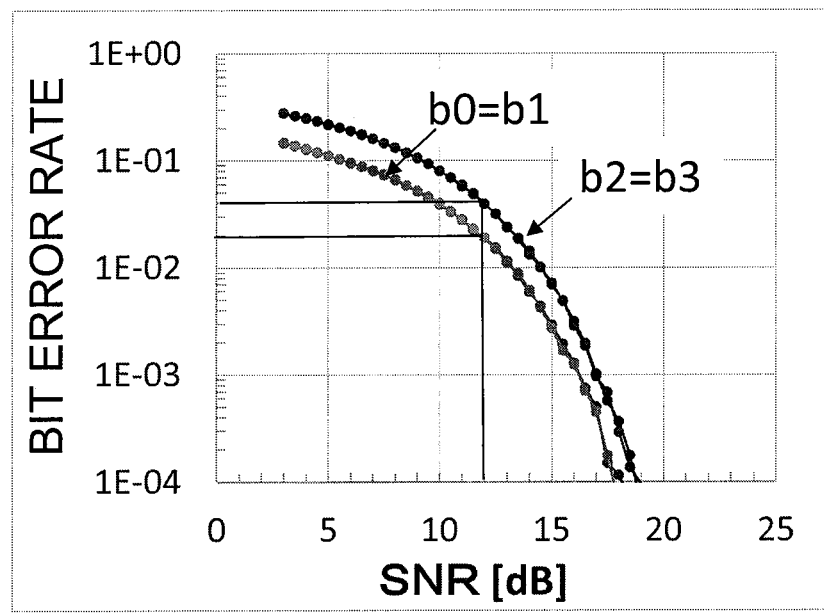
FIG. 11A is a characteristic graph for showing a relationship between an SNR and a bit error rate in 16-QAM in the optical transmission/reception device according to the first embodiment of the present invention.

FIG. 11A is an example of a characteristic graph for showing a relationship of the error rate of each bit with respect to an SNR in 16-QAM. For example, the following case is considered: as indicated by the broken lines of FIG. 11A, the error rate of each bit after correction at an SNR of 12 dB is desired to be equal to or smaller than a threshold value set in advance, for example, $10^{-15}$.

To achieve this, the control circuit 12 appropriately selects and sets, for the bits b0 and b1, the window size win and the decoding iteration count itr for correcting an error rate of $2\times10^{-2}$ to $10^{-15}$ or less.

At the same time, the control circuit 12 further appropriately selects and sets, for the bits b2 and b3, the window size win and the decoding iteration count itr for correcting an error rate of $4\times10^{-2}$ to the threshold value, for example, $10^{-15}$, or less.

Thus, a large portion of the decoding operation circuit and the memory is allocated to the bits b2 and b3, and a small portion of the decoding operation circuit and the memory is allocated to the bits b0 and b1. With this setting, it is possible to flexibly handle throughputs and error correction performance of various granularities without changing the circuit configuration at all.

Figure 11B:
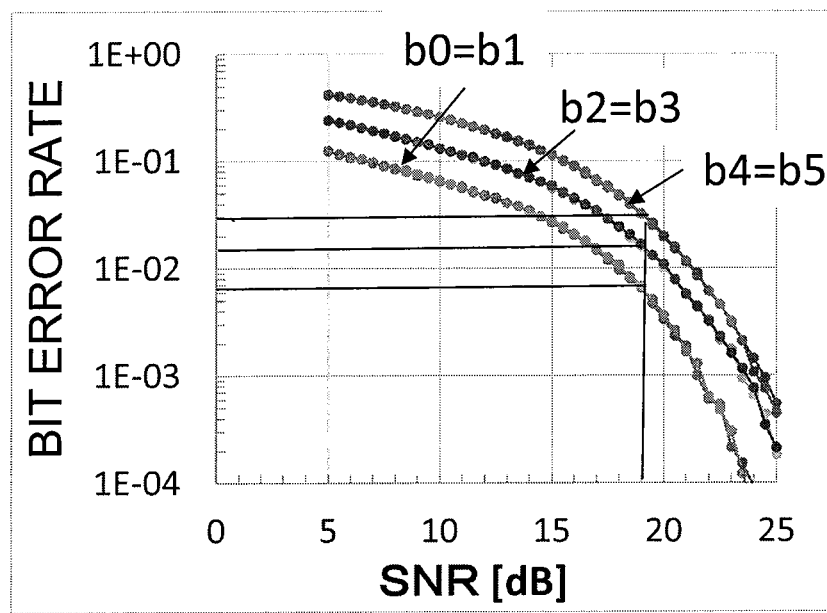
FIG. 11B is a characteristic graph for showing a relationship between an SNR and a bit error rate in 64-QAM in the optical transmission/reception device according to the first embodiment of the present invention.

Similarly, FIG. 11B is an example of a characteristic graph for showing a relationship of the bit error rate with respect to an SNR in 64-QAM. For example, the following case is considered: as indicated by the broken lines of FIG. 11B, the error rate of each bit after correction at an SNR of 19 dB is desired to be equal to or smaller than a threshold value set in advance, for example, $10^{-15}$.

To achieve this, the control circuit 12 appropriately selects and sets, for the bits b0 and b1, the window size win and the decoding iteration count itr for correcting an error rate of $6\times10^{-3}$ to $10^{-15}$ or less.

At the same time, the control circuit 12 further appropriately selects and sets, for the bits b2 and b3, the window size win and the decoding iteration count itr for correcting a bit error rate of $1.5\times10^{-2}$ to $10^{-15}$ or less.

At the same time, the control circuit 12 further appropriately selects and sets, for the bits b4 and b5, the window size win and the decoding iteration count itr for correcting a bit error rate of $3\times10^{-2}$ to $10^{-15}$ or less.

Thus, a large portion of the decoding operation circuit and the memory is allocated to the bits b4 and b5, a small portion of the decoding operation circuit and the memory is allocated to the bits b0 and b1, and an intermediate-sized portion of the decoding operation circuit and the memory is allocated to the bits b2 and b3. With this setting, it is possible to flexibly handle throughputs and error correction performance of various granularities without changing the circuit configuration at all.

Signals subjected to the decoding processing by the error correction decoding unit 36 in the manner described above are input to the client signal generation unit 37. When a parity bit of HD-FEC is added on the transmission side, the client signal generation unit 37 performs the decoding processing for HD-FEC. The signals subjected to the decoding processing are retrieved as client signals, and, for example, an overhead is added thereto as required to generate the signals as client signals. The output from the client signal generation unit 37 is input to the client IF (OUT) 38, and then output to an external device, for example, each client module.

In this manner, for each bit forming a symbol, the window size win and the decoding iteration count itr are configured to be variable depending on the error rate of the bit. With this configuration, it is possible to flexibly handle throughputs and multi-level encoding of various granularities without changing the circuit configuration at all, to thereby achieve high frequency usage efficiency with a small circuit scale.

As described above, the optical transmission/reception device according to the first embodiment includes the error correction decoding unit 36 formed from the error correction decoding device for decoding the received sequence encoded with the LDPC code. The error correction decoding unit 36 performs decoding processing that uses the check matrix of the LDPC convolutional code, and in the check matrix of the LDPC convolutional code, a plurality of check submatrices are combined with each other in the LDPC rule structure. Further, the decoding processing is windowed decoding processing of sequentially performing decoding in units of windows by using the window 80 extending over one or more check submatrices 71. The windowed decoding processing is repeatedly executed by the number of times corresponding to the decoding iteration count.

In the first embodiment, the window size win of the window 80 and the decoding iteration count itr are configured to be variable, and are input from the control circuit 12 connected to the error correction decoding unit 36.

The control circuit 12 determines the window size win and the decoding iteration count itr based on the error rate of each bit forming the symbol of the optical signal transmitted/received by the optical transmission/reception device and on the throughput input to the error correction decoding unit 36.

With this configuration, the optical transmission/reception device according to the first embodiment has a configuration of configuring the window size win and the decoding iteration count itr to be variable, and appropriately changing the window size win and the decoding iteration count itr in accordance with the error rate of each bit, which differs for each multi-level modulation method, and the throughput input to the error correction decoding unit 36. As a result, it is possible to handle various throughputs and various multi-level modulation methods, to thereby be able to support the multi-level encoding. As described above, in the first embodiment, with the configuration in which the window size win and the decoding iteration count itr are configured to be variable, it is possible to handle throughputs of various granularities and various multi-level modulation methods without changing the circuit configuration at all, to thereby achieve high frequency usage efficiency with a small circuit scale and low power consumption.

Further, in the first embodiment, it is only required to perform encoding with one type of LDPC convolutional code, and hence it is possible to implement error correction encoding supporting the multi-level encoding with a small circuit scale.

Still further, an error correction code having the same code length and redundancy is used for each bit forming a symbol, and hence the accommodation of a client signal and the configuration of symbol mapping are not complicated. As a result, it is possible to implement the optical transmission/reception device having a small circuit scale.

While the multi-level encoding for the 16-QAM and 64-QAM modulation methods is described in the first embodiment, a similar effect can also be obtained for 8-QAM or other modulation methods in which the error rate of each bit differs from one bit to another.

Second Embodiment

In a second embodiment of the present invention, another configuration of the error correction decoding unit 36 is described with reference to FIG. 12. The second embodiment differs from the first embodiment only in the configuration of the error correction decoding unit 36, and other configurations and operations of the second embodiment are the same as those of the first embodiment. A description thereof is therefore omitted here.

In the first embodiment described above, as illustrated in FIG. 5, the LDPC convolutional code decoding operation circuit 3622 provided in the error correction decoding unit 36 is constructed by one large arithmetic core circuit. When the LDPC convolutional code decoding operation circuit 3622 is constructed by one large arithmetic core circuit in this manner, the complexity of the circuit increases. When the window size win and the decoding iteration count itr can be freely set, estimation of the scale of the decoding processing circuit becomes difficult, and as a result, re-designing of the decoding processing circuit may be required.

FIG. 12 is an illustration of the configuration of the error correction decoding unit 36 in the second embodiment. As illustrated in FIG. 12, in the second embodiment, two or more small sized small-scale decoding operation circuits 3623 are arranged in parallel instead of the LDPC convolutional code decoding operation circuit 3622 illustrated in FIG. 5.

Those small-scale decoding operation circuits 3623 can all be implemented by the same circuit configuration.

In the second embodiment, with the configuration in which the plurality of small-scale decoding operation circuits 3623 are arranged in the above-mentioned manner, the following effect is obtained as compared with the LDPC convolutional code decoding operation circuit 3622 of FIG. 5. For example, a small number of small-scale decoding operation circuits 3623 are allocated in order to process the bits b0 and b1 of 16-QAM, and a large number of small-scale decoding operation circuits 3623 are allocated in order to process the bits b2 and b3. With this setting, it is possible to facilitate control of the window size win and the decoding iteration count itr.

As described above, in the second embodiment, there is employed a control method in which, for each bit or bit group to be subjected to the multi-level encoding, the control circuit controls the number of small-scale decoding operation circuits 3623 to be allocated to the bit or bit group.

In the second embodiment, with the configuration described above, it is possible to flexibly design, construct, and control the circuit scale, error correction performance, and throughput of the error correction decoding unit 36 supporting the multi-level encoding.

As described above, also in the second embodiment, it is possible to obtain an effect similar to that of the first embodiment. Further, in the second embodiment, the error correction decoding unit 36 is constructed by two or more small-scale decoding operation circuits 3623, and hence it is possible to flexibly design and construct the circuit scale, error correction performance, and throughput of the error correction decoding unit 36 supporting the multi-level encoding.

Third Embodiment

In the first embodiment and the second embodiment, there has been described the configuration in which, in the decoding operation processing for the LDPC convolutional code, the window size and the decoding iteration count are controlled to be set for each bit or bit group in the multi-level encoding. However, the present invention is not limited to the LDPC convolutional code. For example, in decoding operation processing for an LDPC block code, the decoding iteration count itr may be controlled to be set for each bit or bit group in the multi-level encoding. Even with this configuration, it is possible to obtain a similar effect.

REFERENCE SIGNS LIST 11, 12, 13 control circuit, 21 client IF (IN), 22 client signal accommodation unit, 23 error correction encoding unit, 24 symbol mapping unit, 25 waveform shaping unit, 26 D/A conversion unit, 27 optical transmission unit, 31 optical reception unit, 32 A/D conversion unit, 33 waveform distortion compensation unit, 34 timing detection unit, 35 likelihood calculation unit, 36 error correction decoding unit, 37 client signal generation unit, 38 client IF (OUT), 231, 361 interleaver, 232 error correction code processing unit, 233, 363 deinterleaver, 362 LDPC convolutional code decoding processing unit, 3621 memory, 3622 LDPC convolutional code decoding operation circuit, 3623 small-scale decoding operation circuit

The invention claimed is:

1. An optical transmission/reception device, comprising:
an error correction encoding device configured to encode a sequence to be transmitted with one type of LDPC code;
an error correction decoding device configured to decode a received sequence encoded with the one type of LDPC code; and
a control circuit configured to control the error correction encoding device and the error correction decoding device,
wherein the error correction encoding device is configured to perform encoding processing for the sequence to be transmitted based on a check matrix of an LDPC convolutional code having one type of redundancy and code length,
wherein the error correction decoding device is configured to perform decoding processing for the received sequence based on the check matrix of the LDPC convolutional code,
wherein the check matrix of the LDPC convolutional code includes a plurality of check submatrices combined with each other in an LDPC rule structure,
wherein the decoding processing includes windowed decoding processing of sequentially performing decoding in units of windows by using a window including, at least partially, one or more check submatrices,
wherein the windowed decoding processing is repeatedly executed by a number of times corresponding to a decoding iteration count,
wherein a window size of the window and the decoding iteration count are configured to be variable depending on a throughput input to the error correction decoding device, and
wherein the window size and the decoding iteration count are input from the control circuit to the error correction decoding device, and
wherein the control circuit is configured to determine the window size and the decoding iteration count in accordance with an error rate of each bit of a symbol forming the received sequence, and the throughput input to the error correction decoding device.

2. An error correction device, comprising:
an error correction encoder configured to encode a sequence to be transmitted with one type of LDPC code; and
an error correction decoder configured to decode a received sequence encoded with the one type of LDPC code,
wherein the error correction encoder is configured to perform encoding processing for the sequence to be transmitted based on a check matrix of an LDPC convolutional code having one type of redundancy and code length,
wherein the error correction decoder is configured to perform decoding processing for the received sequence based on the check matrix of the LDPC convolutional code,
wherein the check matrix of the LDPC convolutional code includes a plurality of check submatrices combined with each other in an LDPC rule structure,
wherein the decoding processing includes windowed decoding processing of sequentially performing decoding in units of windows by using a window including, at least partially, one or more check submatrices,
wherein the windowed decoding processing is repeatedly executed by a number of times corresponding to a decoding iteration count,
wherein a window size of the window and the decoding iteration count are configured to be variable depending on a throughput input to the error correction decoder, and
wherein the window size and the decoding iteration count are input from an external control circuit connected to the error correction decoder, and
wherein the control circuit is configured to determine the window size and the decoding iteration count in accordance with an error rate of each bit of a symbol forming the received sequence, and the throughput input to the error correction decoder.

3. The optical transmission/reception device of claim 1, wherein a maximum value of the decoding iteration count is set so that a product of the window size of the window and the decoding iteration count is equal to or smaller than a unit time required for the decoding processing.

4. The error correction device of claim 2, wherein a maximum value of the decoding iteration count is set so that a product of the window size of the window and the decoding iteration count is equal to or smaller than a unit time required for the decoding processing.

* * * * *